(12) United States Patent  (10) Patent No.: US 9,887,273 B2
Ishida et al.  (45) Date of Patent: Feb. 6, 2018

(54) SEMICONDUCTOR MEMORY DEVICE (71) Applicant: Toshiba Memory Corporation, Minato-ku (JP)

(72) Inventors: Tatsuo Ishida, Kuwana (JP); Hiroshi Kanno, Yokkaichi (JP); Hironobu Hamanaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/212,463

(22) Filed: Jul. 18, 2016

(65) Prior Publication Data

US 2017/0288038 A1 Oct. 5, 2017

Related U.S. Application Data (60) Provisional application No. 62/316,191, filed on Mar. 31, 2016.

(51) Int. Cl.
| | |
|---|---|
| *H01L 29/66* | (2006.01) |
| *H01L 27/1157* | (2017.01) |
| *H01L 27/11582* | (2017.01) |
| *H01L 27/11573* | (2017.01) |
| *H01L 23/522* | (2006.01) |

(Continued)

(52) U.S. Cl.
CPC ...... *H01L 29/66537* (2013.01); *H01L 23/528* (2013.01); *H01L 23/5226* (2013.01); *H01L 23/53271* (2013.01); *H01L 27/1157* (2013.01); *H01L 27/11573* (2013.01); *H01L 27/11582* (2013.01); *H01L 29/1033* (2013.01)

(58) Field of Classification Search
None
See application file for complete search history.

(56) References Cited

U.S. PATENT DOCUMENTS

| | | |
|---|---|---|
| 6,876,045 B2 | 4/2005 | Takagi |
| 2011/0233648 A1 | 9/2011 | Seol et al. |

(Continued)

FOREIGN PATENT DOCUMENTS

| | | |
|---|---|---|
| JP | 2010-16214 | 1/2010 |
| JP | 4460307 | 5/2010 |
| JP | 5832114 | 12/2015 |

*Primary Examiner* — Marc Armand
*Assistant Examiner* — Sue Tang
(74) *Attorney, Agent, or Firm* — Oblon, McClelland, Maier & Neustadt, L.L.P.

(57) ABSTRACT

A semiconductor memory device includes a conductive layer on a source side; a first electrode layer provided on the conductive layer; a second electrode layer provided between the conductive layer and the first electrode layer; a semiconductor layer extending through the first electrode in a first direction from the conductive layer to the first electrode layer; a first semiconductor body provided between the conductive layer and the semiconductor layer, the first semiconductor body including first impurities; and a second semiconductor body provided between the conductive layer and the first semiconductor body, the second semiconductor body including second impurities with a higher concentration than a concentration of the first impurities in the first semiconductor body. A diffusion coefficient of the second impurities in the second semiconductor body is smaller than a diffusion coefficient of the second impurities in the first semiconductor body.

27 Claims, 8 Drawing Sheets (51) Int. Cl.
*H01L 23/528* (2006.01)
*H01L 23/532* (2006.01)
*H01L 29/10* (2006.01)

(56) References Cited

U.S. PATENT DOCUMENTS

| | | | |
|---|---|---|---|
| 2012/0213009 A1* | 8/2012 | Aritome | G11C 16/0408 365/185.29 |
| 2013/0049095 A1* | 2/2013 | Whang | H01L 27/11556 257/321 |
| 2013/0334593 A1 | 12/2013 | Seol et al. | |
| 2015/0104916 A1* | 4/2015 | Lee | H01L 27/1157 438/268 |
| 2015/0311301 A1 | 10/2015 | Seol et al. | |
| 2016/0079309 A1* | 3/2016 | Ota | H01L 27/2454 257/4 |

* cited by examiner

SEMICONDUCTOR MEMORY DEVICE

CROSS-REFERENCE TO RELATED APPLICATIONS

This application is based upon and claims the benefit of priority from U.S. Provisional Patent Application 62/316,191 filed on Mar. 31, 2016; the entire contents of which are incorporated herein by reference.

FIELD

Embodiments are generally related to a semiconductor memory device.

BACKGROUND

A NAND type semiconductor memory device, which includes three-dimensionally disposed memory cells, includes a plurality of electrode layers stacked on a substrate, semiconductor channel bodies extending through the electrode layers and a conductive layer provided in the substrate. Such a semiconductor memory device includes memory cells and selection transistors provided along each semiconductor channel bodies. Thus, when impurity doping into the semiconductor channel bodies is performed so as to set threshold voltages of the selection transistors at a desirable value, there may be a reduction of cell current while reading data out from the memory cells.

DETAILED DESCRIPTION

According to one embodiment, a semiconductor memory device includes a conductive layer on a source side; a first electrode layer provided on the conductive layer; a second electrode layer provided between the conductive layer and the first electrode layer; a semiconductor layer extending through the first electrode in a first direction from the conductive layer to the first electrode layer; a first semiconductor body provided between the conductive layer and the semiconductor layer, the first semiconductor body including first impurities; and a second semiconductor body provided between the conductive layer and the first semiconductor body, the second semiconductor body including second impurities with a higher concentration than a concentration of the first impurities in the first semiconductor body. A diffusion coefficient of the second impurities in the second semiconductor body is smaller than a diffusion coefficient of the second impurities in the first semiconductor body.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
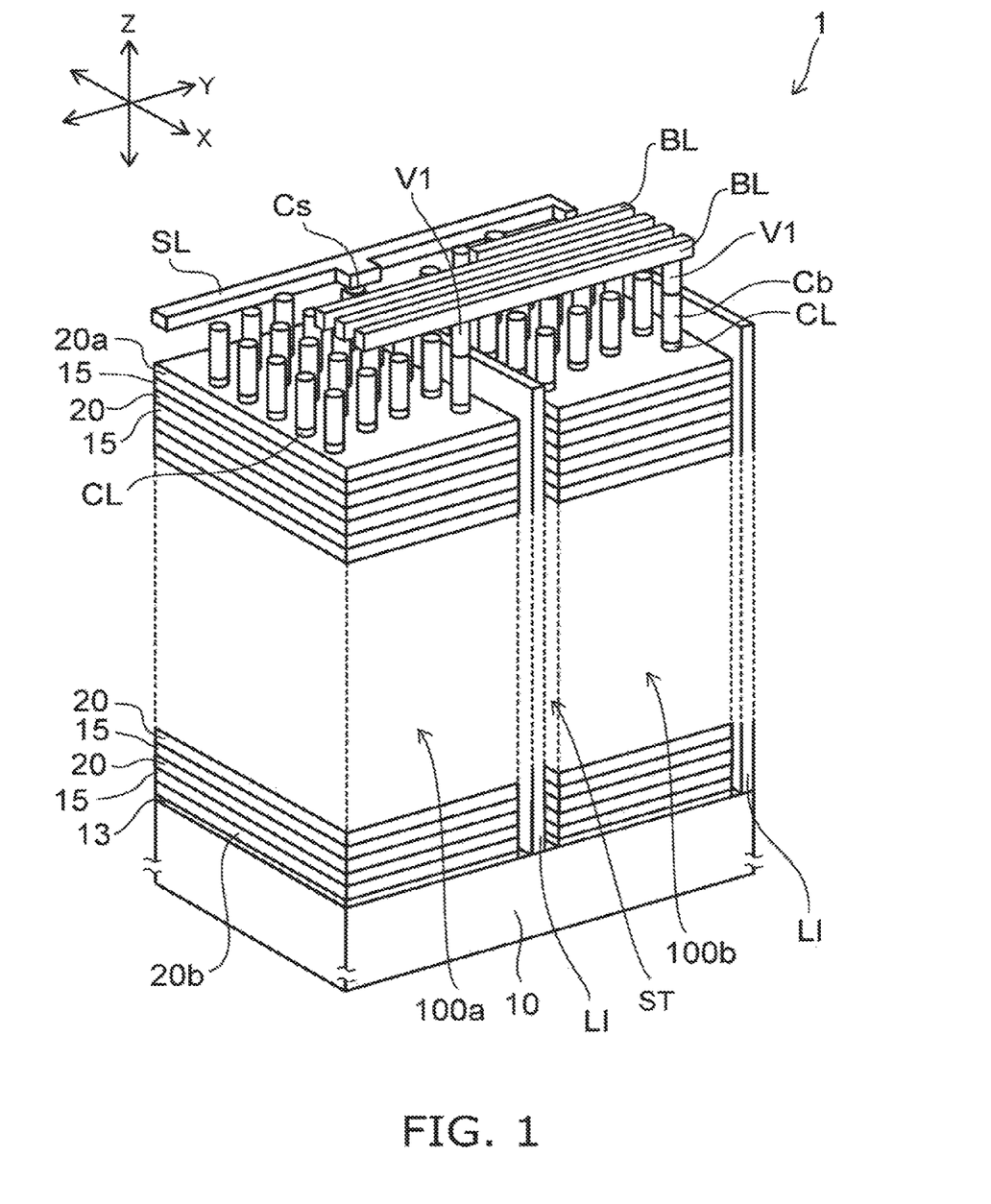
FIG. 1 is a perspective view schematically showing a semiconductor memory device according to an embodiment.

FIG. 1 is a perspective view schematically showing a semiconductor memory device 1 according to an embodiment. The semiconductor memory device 1 is, for example, a NAND type memory device, and includes three-dimensionally disposed memory cells.

As shown in FIG. 1, the semiconductor memory device 1 includes a conductive layer (hereinafter, a source layer 10), stacked bodies 100a and 100b. The stacked bodies 100a and 100b are arranged in the Y-direction on the source layer 10. The stacked bodies 100a and 100b each include a plurality of electrode layers 20 and a plurality of insulating layers 15. The electrode layers 20 are stacked on the source layer 10 via an insulating layer 13 interposed. Each electrode layer 20 and each insulating layer 15 are alternately stacked in a first direction (hereinafter, the Z-direction) that is a stacking direction of the electrode layers 20. An insulating layer 15 electrically insulates one electrode layer 20 from another electrode 20 adjacent to the one electrode layer in the Z-direction.

The source layer 10 is, for example, a P-type well provided in a silicon substrate (not shown). Alternatively, the source layer 10 may be a poly-crystalline silicon layer provided on the silicon substrate with an inter-layer insulating layer (not shown) interposed. The electrode layers 20 are metal layers, for example, containing tungsten (W). The insulating layers 15 are, for example, silicon oxide layers.

Each of the stacked bodies 100a and 100b includes a plurality of columnar bodies CL extending in the Z-direction through the electrode layers 20 and the insulating layers 15. Each of the columnar bodies CL is electrically connected to a bit line BL via contact plugs Cb and V1. The bit line BL extends, for example, in the Y-direction above the stacked bodies 100a and 100b. One of the columnar bodies CL provided in the stacked body 100a and one of the columnar bodies CL provided in the stacked body 100b share one bit line BL. It should be noted that for convenience in showing the structure of the semiconductor memory device 1, insulating layers 27, 35 and 37 (see FIG. 2A) are omitted in FIG. 1, which are provided between bit lines BL and an electrode layer 20a that is the uppermost layer of the electrode layers 20.

The semiconductor memory device 1 further includes a source line SL and source contact bodies LI electrically connected to the source layer 10. In the case where the source layer 10 is the P-type well, N-type diffusion layers (not shown) having high impurity concentration are provided respectively at a part of the source layer 10 to which a source contact body LI is electrically connected. That is, the source contact bodies LI are electrically connected to the source layer 10 via the N-type diffusion layers. Alternatively, the whole source layer 10 may include polycrystalline silicon having N-type conductivity. Also, a polycrystalline silicon layer having N-type conductivity may be provided between the source layer 10 and each of the stacked bodies 100a and 100b.

A source contact body LI is provided in a slit ST between the stacked body 100a and the stacked body 100b. The source contact body LI is, for example, a plate-shaped metal body extending in the X-direction and the Z-direction. Also, the source contact body LI is electrically connected to the source line SL via a contact plug Cs. That is, the source line SL is electrically connected to the source layer 10 via the source contact bodies LI. The source line SL extends, for example, in the Y-direction above the stacked bodies 100a and 100b.

Figure 2A:
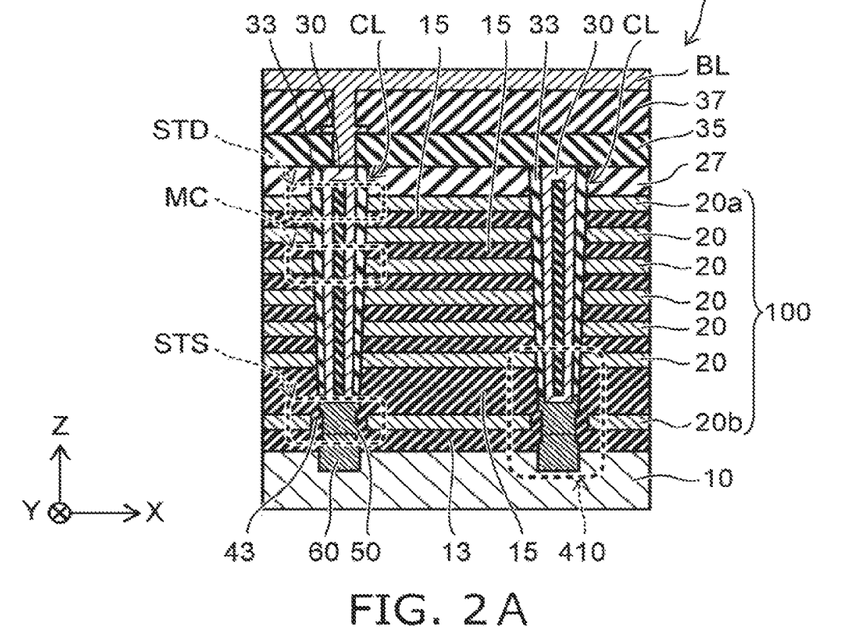
FIGS. 2A to 2C are schematic cross-sectional views showing the semiconductor memory device according to the embodiment.

FIG. 2A is a schematic cross-sectional view showing the semiconductor memory device 1 according to the embodiment. FIG. 2A is a schematic view, for example, showing a cross section along the Y-Z plane of the stacked body 100. Hereinbelow, the stacked body 100a and 100b are referred to as the stacked body 100 without distinguishing each other.

A plurality of columnar bodies CL extend in the Z-direction through the electrode layers 20 and the insulating layers 15 are provided in the semiconductor memory device 1. The columnar bodies CL each include a semiconductor layer 30, semiconductor bodies 50, 60 and an insulating layer 33. The semiconductor bodies 50 and 60 are provided between the source layer 10 and the semiconductor layer 30.

The semiconductor layer 30 has, for example, a polycrystalline structure, and extends in the Z-direction in a columnar body CL. The semiconductor bodies 50 and 60 have, for example, a single crystalline structure respectively, and are epitaxially grown on the source layer 10. The semiconductor body 50 is provided between the semiconductor layer 30 and the semiconductor body 60. The semiconductor body 60 is provided between the source layer 10 and the semiconductor body 50, and includes impurities doped with a higher concentration than a concentration of impurities in the semiconductor body 50.

The semiconductor body 50 is electrically connected to the semiconductor layer 30 and the semiconductor body 60 respectively. The semiconductor body 60 is electrically connected to the source layer 10 and the semiconductor body 50 respectively.

The insulating layer 33 is positioned between the electrode layers 20 and the semiconductor layer 30, and extends in the Z-direction along the semiconductor layer 30. The semiconductor layer 30 is electrically connected to a bit line BL via contact plugs Cb and V1.

The semiconductor body 50 is provided so as to extend through an electrode layer 20b that is the lowermost layer of the electrode layers 20. An insulating layer 43 is provided between the electrode layer 20b and the semiconductor body 50. The insulating layer 43 is, for example, a silicon oxide layer.

A selection transistor STS on the source side, memory cells MC and a selection transistor STD on the drain side are provided respectively at a portion where a columnar body CL extends through each electrode layer 20. The selection transistor STS is provided, for example, at a portion where the semiconductor body 50 extends through the electrode layer 20b. The selection transistor STD is provided, for example, at a portion where the semiconductor layer 30 extends through an electrode layer 20a that is the uppermost layer. The memory cells MC are provided respectively at a portion where the semiconductor layer 30 extends through an electrode layer 20 between the selection transistors STS and STD. Thus, the semiconductor memory device 1 includes a plurality of memory cells MC, the selection transistors STS and STD, which are disposed along the columnar body CL extending in the Z-direction.

The semiconductor bodies 50 and 60 acts respectively as a part of the channel body of the selection transistor STS. The electrode layer 20b acts as the selection gate of the selection transistor STS. The semiconductor layer 30 acts as channel bodies of the memory cells MC and the selection transistor STD. The electrode layer 20a acts as the selection gate of the selection transistor STD. Electrode layers 20 positioned between the electrode layers 20a and 20b act as control gates of the memory cells MC respectively.

The insulating layer 33 has, for example, so-called an ONO structure (see FIG. 3D described below) in which a silicon oxide, a silicon nitride and another silicon oxide are stacked in order in a direction toward the semiconductor layer 30 from an electrode layer. The insulating layer 33 includes a portion positioned between an electrode layer 20 and the semiconductor layer 30, which acts as a charge storage portion of a memory cell MC. The insulating layer 33 may include a conductive body acting as a floating gate between the electrode layer 20 and the semiconductor layer 30.

Figure 2B:
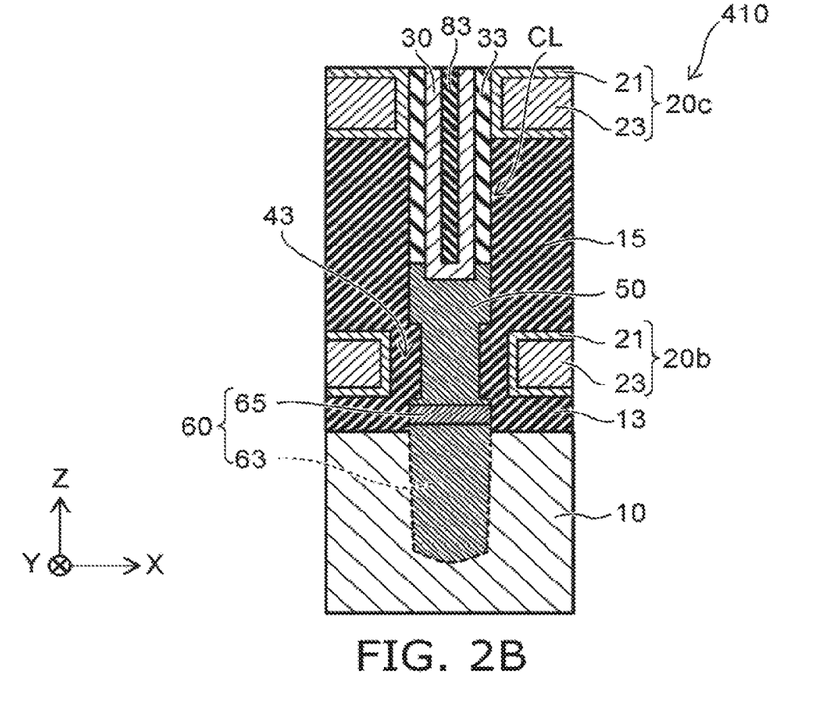

FIG. 2B is a magnified view of an area 410 surrounded by a dashed line in FIG. 2A. Hereinafter, a structure of the bottom portion in the columnar body CL is described with reference to FIG. 2B.

As shown in FIG. 2B, the columnar body CL includes semiconductor bodies 50 and 60 in the bottom end thereof. A material having a smaller diffusion coefficient of impurities than that in a material of the semiconductor body 50 is used for the semiconductor body 60. The semiconductor body 50 is, for example, a silicon layer. The semiconductor body 60 is the one including, for example, silicon as a main constituent, and at least one of germanium and carbon is added thereto. The semiconductor body 60 includes semiconductor, for example, represented by a compositional formula of $Si_{1-X}Ge_XC_Y$ ($0 \leq X < 1$, $0 \leq Y < 1$).

The semiconductor body 50 extends through the electrode layer 20b, and the top end thereof locates, for example, at a level between the electrode layer 20b and an electrode layer 20c. The electrode layer 20c is the one adjacent to the electrode 20b in the Z-direction. The bottom end of the semiconductor body 50 locates, for example, at a level between the electrode layer 20b and the source layer 10. The semiconductor body 50 is not limited to this example, and may be provided so as to extend through both the electrode layers 20b and 20c, for example. The electrode layers 20b and 20c each includes, for example, a barrier metal layer 21 and a high-melting-point metal layer 23.

The semiconductor body 50 is, at the top surface thereof, in contact with the bottom ends of the semiconductor layer 30 and the insulating layer 33. The semiconductor body 50 is provided, for example, at the bottom end thereof so as to cover the top surface of the semiconductor body 60.

The semiconductor body 60 includes a first portion 63 and a second portion 65. The second portion 65 is provided between the semiconductor body 50 and the first portion 63. The top end of the semiconductor body 60 is in contact with the semiconductor body 50, and locates at a level between the electrode layer 20b and the source layer 10. The first portion 63 is provided, for example, in the source layer 10, and the bottom end thereof locates at a level lower than the top surface of the source layer 10. The first portion 63 includes impurities with a higher concentration than a concentration of impurities in the second portion 65.

The semiconductor bodies 60 and 50 have, for example, single-crystalline structures epitaxially grown in order on the source layer 10. The semiconductor body 60 is the one obtained, for example, by adding at least one of germanium and carbon to silicon.

Moreover, the semiconductor body 50 may also include silicon and at least one of germanium and carbon, and a concentration thereof is lower than that in the semiconductor body 60. For example, the semiconductor body 60 may include carbon with a higher concentration in a portion positioned at a level of the top surface of the source layer 10 than a concentration of carbon in the end portion of the semiconductor body 50 on the semiconductor layer 30 side.

Figure 2C:
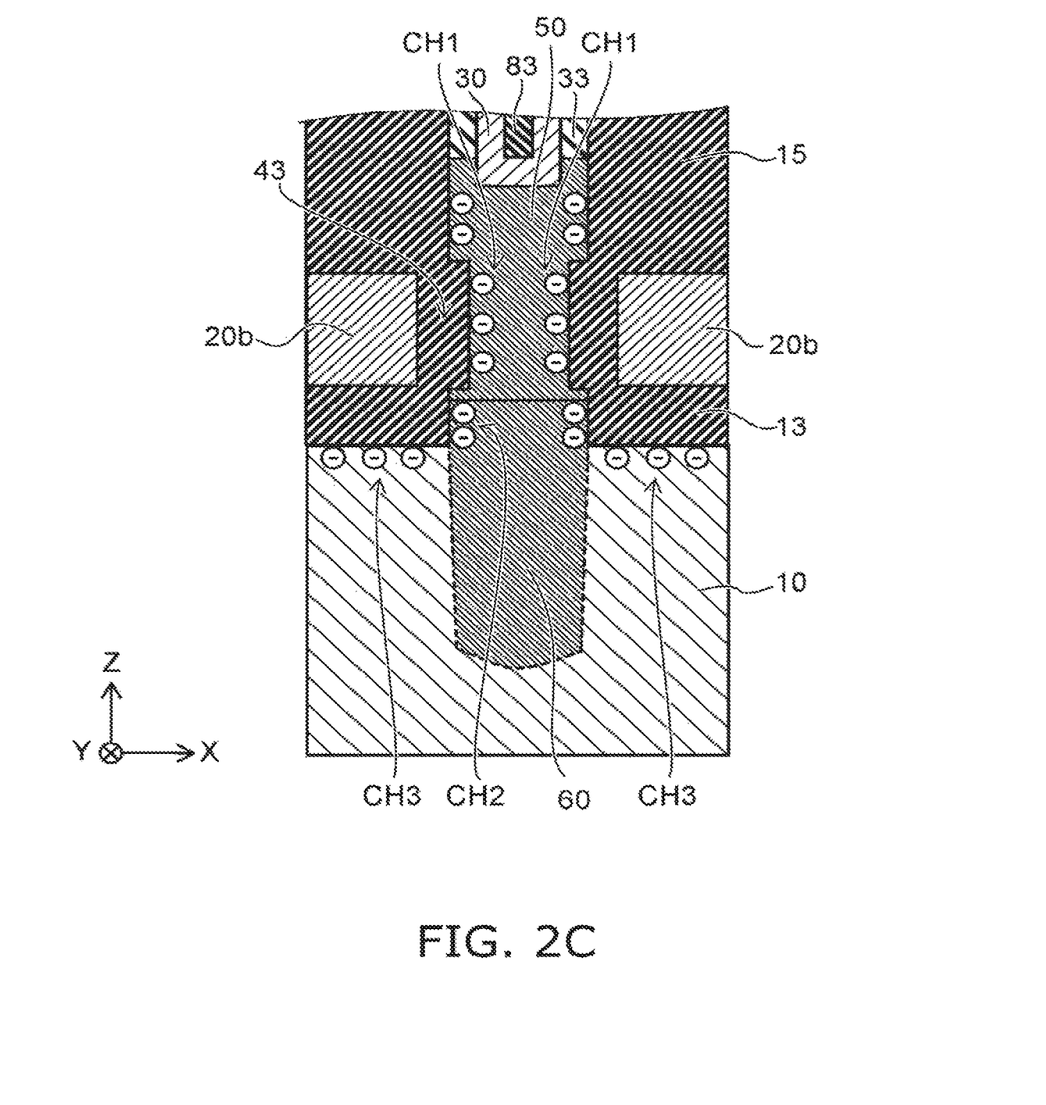

FIG. 2C is a schematic cross-sectional view showing an operation of the selection transistor STS. Hereinafter, the selection transistors STS, STD and the memory cells MC are described as N-type field effect transistors that include electrons as carriers. Moreover, the source layer 10 is described as a P-type well.

For example, when applying positive potential to the selection gate of the selection transistor STS (i.e. the electrode layer 20b), an inversion layer (i.e. a channel CH1) is formed between the gate insulating layer 43 and the semiconductor body 50. Also, an inversion layer (i.e. a channel CH2) is formed between the insulating layer 13 and the semiconductor body 60. Furthermore, electrons also gather at an interface, where the source layer is in contact with the insulating layer 13, forming an inversion layer (i.e. a channel CH3). Thus, the selection transistor STS performs off-on control of electric current between the semiconductor 30 and the source contact body LI via the three channels CH1 to CH3.

In the embodiment, the semiconductor body 60 is doped with boron (B) that is a P-type impurity so that the threshold of the selection transistor is set to be a prescribed value. The concentration of P-type impurities in the semiconductor body 60 is set to be higher than a concentration of P-type impurities in the P-type well. The semiconductor body 50 is, for example, an undoped layer without impurities intentionally doped. As described above, the diffusion coefficient of impurities in the semiconductor body 60 is smaller than the diffusion coefficient of impurities in the semiconductor body 50. Accordingly, it is possible to suppress the impurity diffusions from the semiconductor body 60 toward the semiconductor body 50 while the semiconductor body 50 is formed on the semiconductor body 60, and due to thermal treatment thereafter. Thereby, it is possible to suppress the increase of impurity concentration in the semiconductor body 50. As a result, the selection transistor STS has the threshold controlled by the channel CH2 formed in the semiconductor body 60 that has the highest impurity concentration among the source layer 10, the semiconductor bodies 50 and 60.

Furthermore, it is possible to reduce the concentration of P-type impurities such as boron at a portion, where the semiconductor layer 30 and the semiconductor body 50 are connected, by setting the semiconductor body 50 as an undoped layer and suppressing the impurity diffusion from the semiconductor body 60. Thus, an increase of electric resistance is suppressed at the connection portion of the semiconductor layer 30 and the semiconductor body 50, and it is possible to prevent the reduction of read current when reading data out from the memory cells MC.

Moreover, as shown in FIG. 2B, the semiconductor body 60 may include a first portion 63 and a second portion 65. The first portion 63 is epitaxially grown on the source layer 60, and impurities such as boron are doped therein. The second portion 65 is formed on the first layer 63, for example, as an undoped layer. Although the impurities doped in the first portion 63 are diffused to the second portion 65 by a growth temperature during the epitaxial growth or by thermal treatments thereafter, an amount of impurities is reduced to be less in the semiconductor body 50, which are diffused through the second portion 65 and reach the semiconductor body 50. As a result, the impurity concentration in the second portion 65 is lower than an impurity concentration in the first portion 63 and more than an impurity concentration in the semiconductor body 50.

As described above, the impurity diffusion from the semiconductor body 60 to the semiconductor 50 is further suppressed by providing the second portion 65. Moreover, an amount of the impurities doped in the first layer 63 is set, for example, in view of a diffusion amount of the impurities into the second portion 65, so as to make the threshold voltage of selection transistor STS a desired value.

Hereinafter, a manufacturing method of the semiconductor memory device 1 is described with reference to FIGS. 3A to 3G.

FIGS. 3A to 3G are schematic views showing the manufacturing process of the semiconductor memory device 1 according to the embodiment.

Figure 3A:
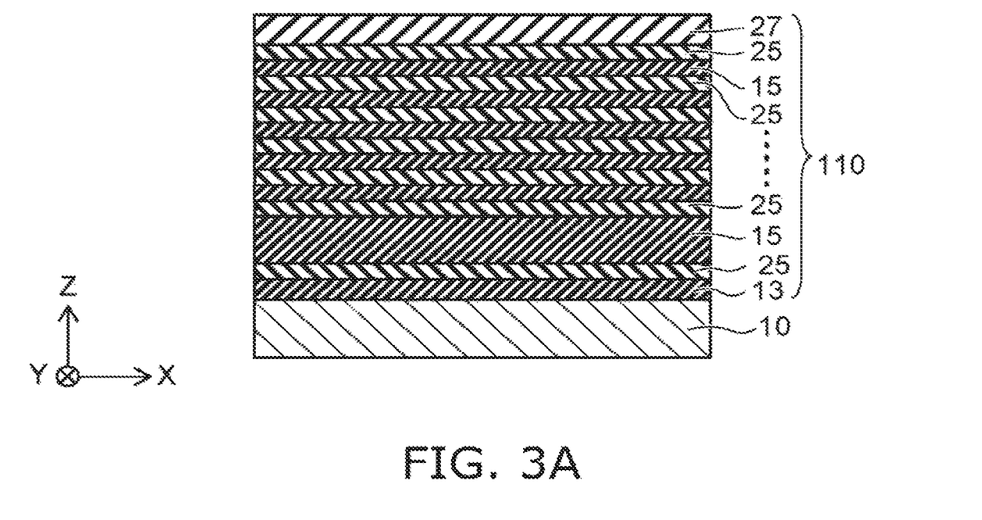
FIGS. 3A to 3J are schematic cross-sectional views showing a manufacturing process of the semiconductor memory device according to the embodiment.

As shown in FIG. 3A, a stacked body 110 is formed on the source layer 10. The stacked layer 110 includes an insulating layer 13, a plurality of insulating layers 15, a plurality of insulating layers 25 and an insulating layer 27. The insulating layer 13 is provided on the source layer 10, and each insulating layer 15 and each insulating layer 25 are alternately stacked on the insulating layer 13. The insulating layer 27 is provided on an insulating layer 25 that is the uppermost layer of the insulating layers 25. The insulating layers 13, 15 and 27 are, for example, silicon oxide layers. The insulating layers 25 are, for example, silicon nitride layers. The insulating layers 13, 15, 25 and 27 are formed, for example, using Chemical Vapor Deposition (CVD).

Figure 3B:
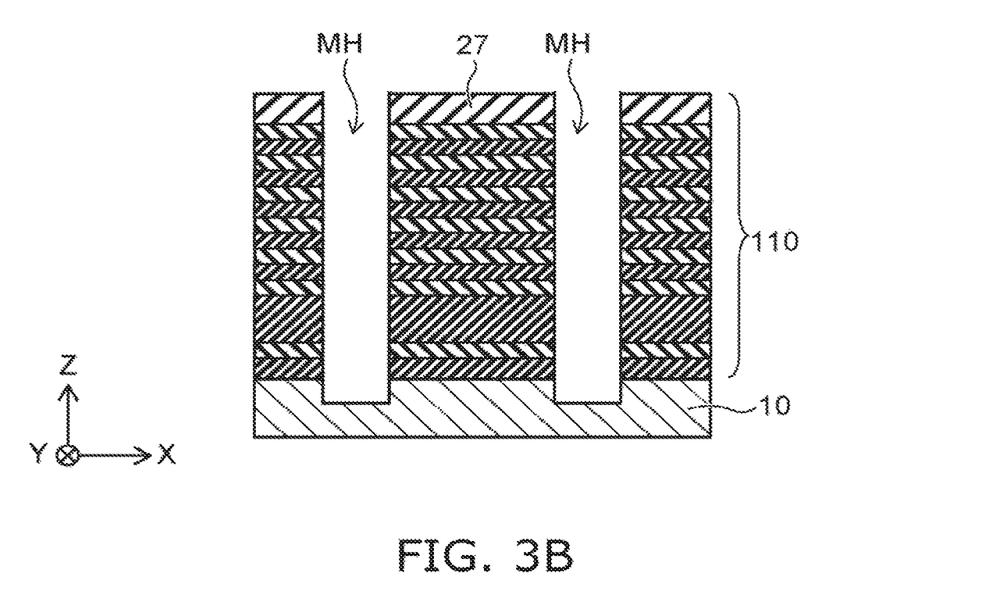

As shown in FIG. 3B, memory holes MH are formed from the top surface of the source layer 10 with a depth capable of reaching the source layer 10. The memory holes MH are formed by selectively removing the insulating layers 13, 15, 25 and 27, for example, by using anisotropic RIE. The bottom portions of the memory holes MH are positioned in the source layer 10.

Figure 3C:
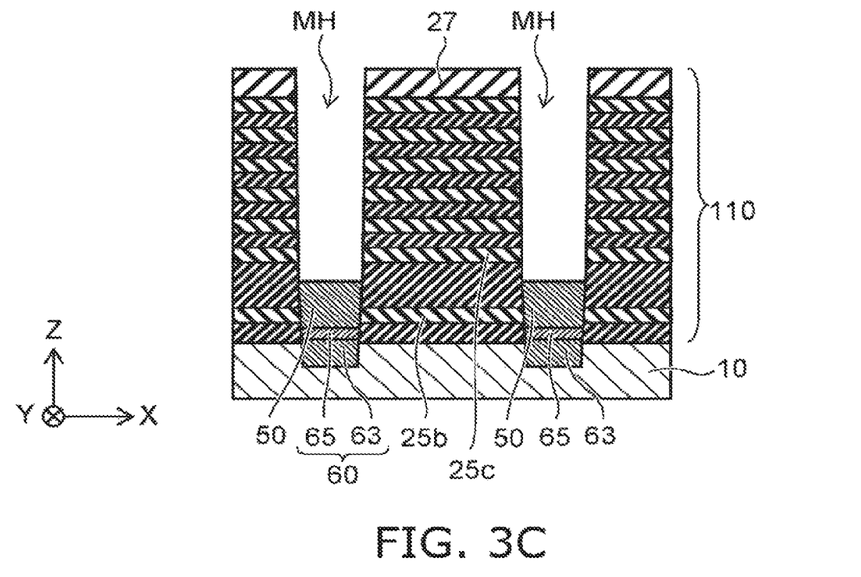

As shown in FIG. 3C, semiconductor bodies 50 and 60 are formed in a bottom portion of each memory hole MH. A first portion 63 of the semiconductor body 60 is formed on the source layer 10. The first portion 63 is epitaxially grown on the source layer 10, for example, using a source gas and an impurity gas, and the source gas in which gases including germanium and carbon respectively are added to a gas containing silicon. The germanium concentration in the first portion 63 is, for example, several tens atomic percent (%). The carbon concentration is, for example, 0.1 to 0.3 atomic %.

The first portion 63 is formed, for example, in the source layer 10 at the bottom of each memory hole MH. The impurity gas includes, for example, boron, arsenic, phosphorus or like. It is possible to reduce an incubation time in the early stage of the epitaxial growth by doping impurities into the first portion 63. Thus, the productivity of the semiconductor memory 1 may be improved. The first portion 63 of the semiconductor body 60 is not limited to this example, and may be formed, for example, using a source gas in which a gas including one of germanium and carbon is added to a gas including silicon.

Then, a second portion 65 of the semiconductor body 60 is epitaxially grown on the first portion 63 after the supply of impurity gas is stopped. The second portion 65 is grown using a source gas in which at least one of a gas including germanium and a gas including carbon is added to a gas including silicon. The second portion 65 may have, for example, the same composition as a composition of the first portion 63, or a different composition from the composition of the first portion 63. The first portion 63 is formed such that the top surface thereof locates at a level between the source layer 10 and an insulating layer 25b. The insulating layer 25b is an insulating layer 25 that is the lowermost layer of the insulating layers 25.

The semiconductor body 50 is further formed on the second portion 65. The semiconductor body 50 is, for example, a silicon layer, and epitaxially grown using a source gas including silicon on the second portion 65. The semiconductor body 50 is, for example, an undoped layer that is grown without adding impurity gas. The semiconductor body 50 is formed such that the bottom end thereof is positioned at a level between the source layer 10 and the insulating layer 25b, and the top end thereof is positioned at a level between the insulating layers 25b and 25c.

In FIG. 3C (and also in other drawings), although a boundary between semiconductor bodies 50 and 60 and a boundary between the first portion 63 and the second portion 65 are shown by solid lines for convenience, there may be intermediate regions at the boundaries respectively. That is, a composition of each semiconductor body may be gradually changed in an intermediate region.

Figure 3D:
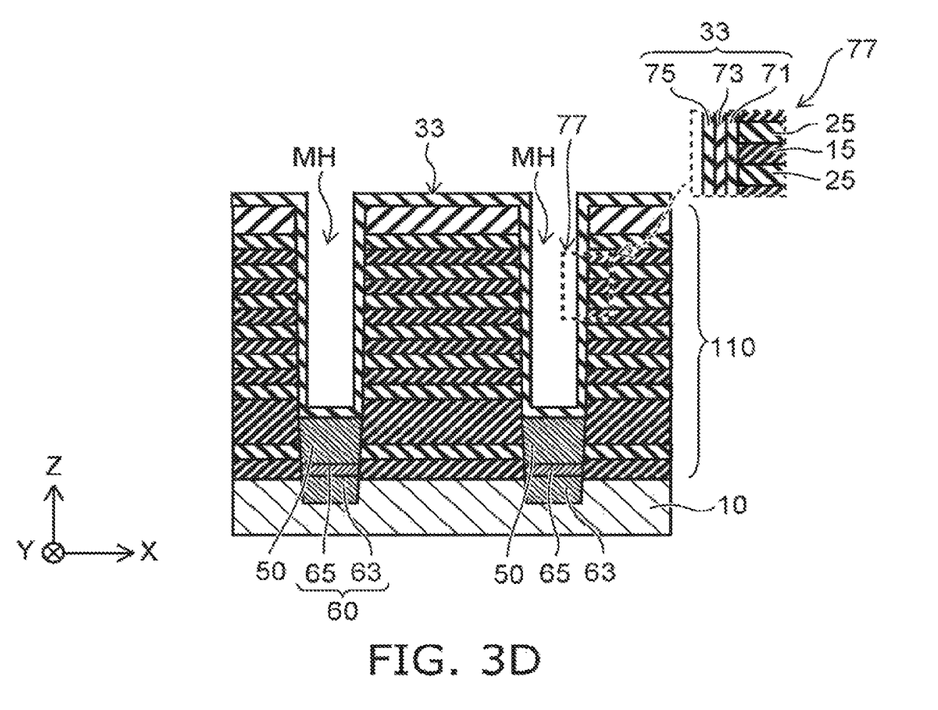

As shown in FIG. 3D, an insulating layer 33 is formed to cover the inner surfaces of the memory holes MH and the top surface of the insulating layer 27. The insulating layer 33 has a structure, for example, in which a first layer 71, a second layer 73 and a third layer 75 are stacked (see a magnified view of an area 77 shown in FIG. 3D). The first layer 71 and the third layer 75 are, for example, silicon oxide layers formed using CVD, and the second layer 73 is, for example, a silicon nitride layer formed using CVD. The first layer 71 may include a high permittivity material such as hafnium oxide and like.

Figure 3E:
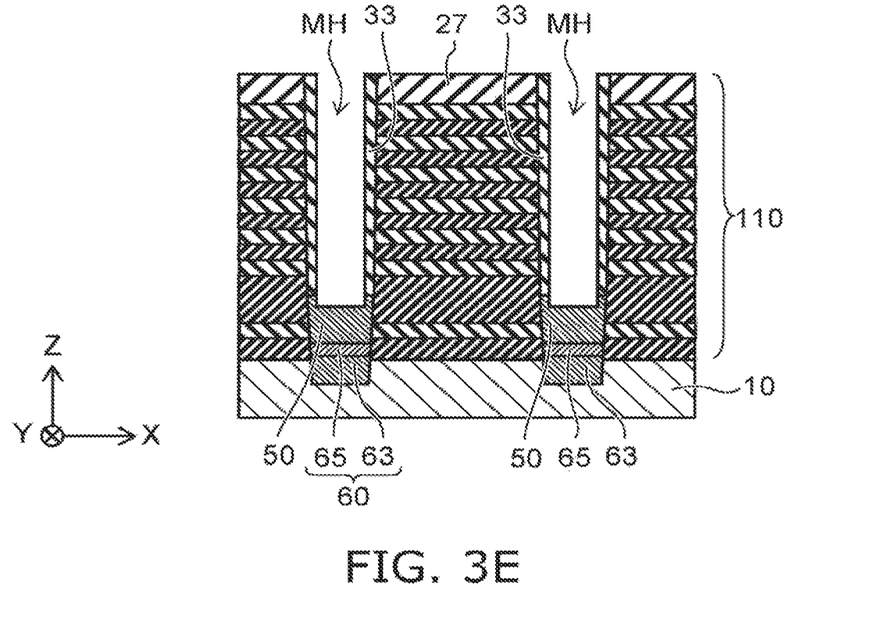

As shown in FIG. 3E, parts of the insulating layer 33 that cover the bottoms of the memory holes MH and another part thereof that covers the top surface of the insulating layer 27 are etched using anisotropic dry etching so as to expose the semiconductor body 50 at the bottom of each memory holes MH.

Figure 3F:
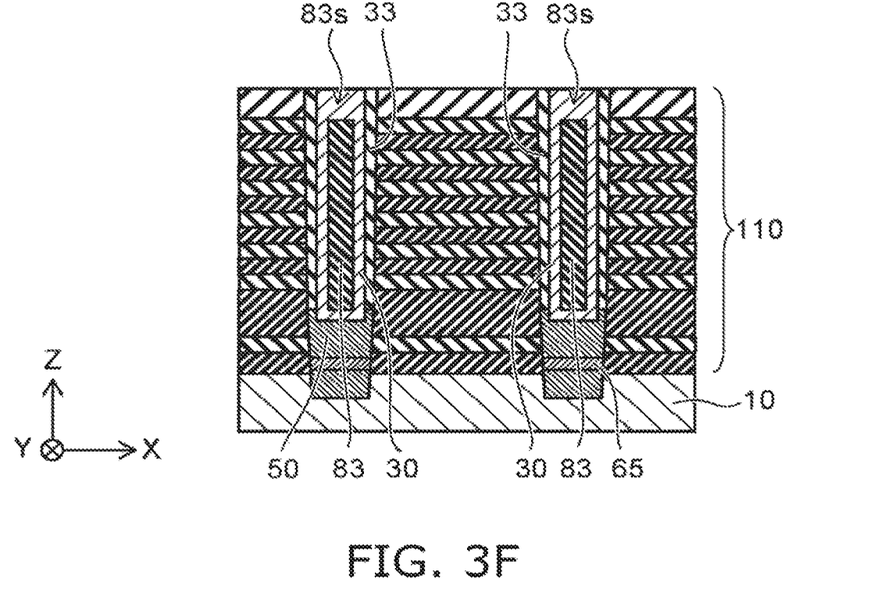

As shown in FIG. 3F, semiconductor layers 30 are formed to cover the inner surfaces of the memory hole MH respectively. The semiconductor layers 30 are, for example, poly-crystalline silicon layers formed using CVD. Furthermore, core bodies 83 are embedded in the memory holes MH respectively. The core bodies 83 are, for example, silicon oxide layers, and formed using CVD. A poly-crystalline silicon layer and a silicon oxide layer deposited on the top surface of the insulating layer 27 through the processes of forming the semiconductor layers 30 and the core bodies 83 are removed, for example, using dry etching. Furthermore, parts of the core bodies 83 formed in the top portions of the memory holes MH are etched back to form spaces 83s on the core bodies 83 respectively.

Figure 3G:
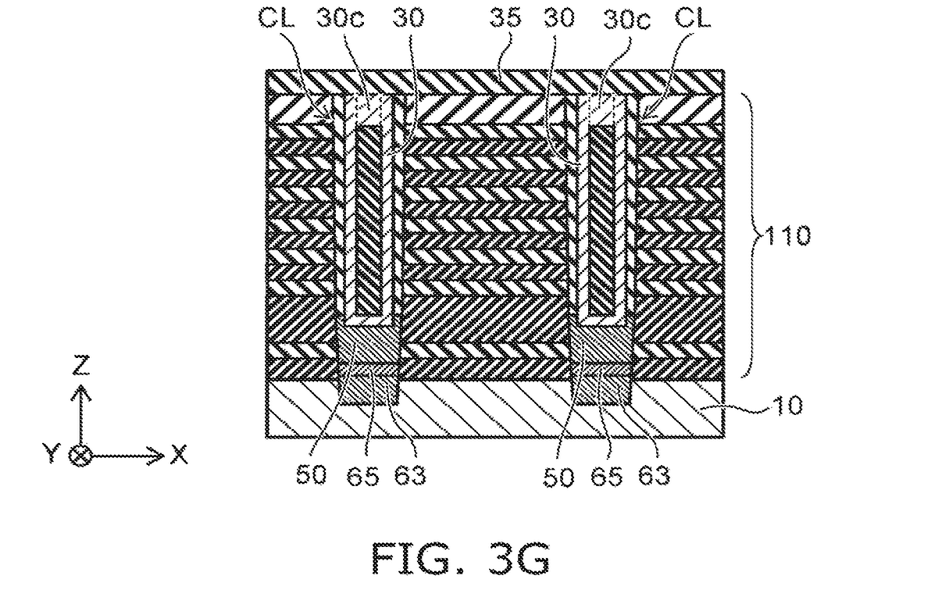

As shown in FIG. 3G, semiconductor bodies 30c are formed to fill the spaces 83s respectively, completing the columnar bodies CL. Then, an insulating layer 35 is formed to cover the columnar bodies CL and the insulating layer 27. The semiconductor bodies 30c are, for example, conductive amorphous silicon bodies formed using CVD. The insulating layer 35 is, for example, a silicon layer formed using CVD.

Figure 3H:
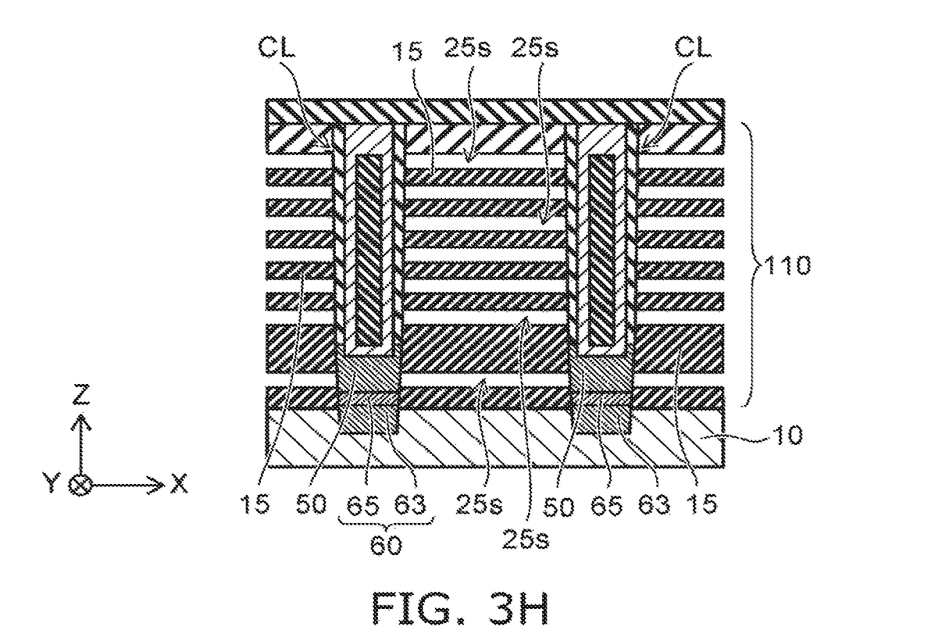

As shown in FIG. 3H, spaces 25s are formed in the stacked body 110 by selectively removing the insulating layers 25. The insulating layers 25 are removed, for example, using wet etching by supplying an etching solution through slits ST (see FIG. 1) that divide the stacked body 110. When the insulating layers 25 are silicon nitride layers, it is possible to selectively remove the insulating layers 25, for example, using hot phosphoric acid solution. The columnar bodies CL support the insulating layers so as to hold the spaces 25s.

The semiconductor body 60 is the one that includes silicon as the main constituent and also includes germanium, and has less resistant to the wet etching above comparing the semiconductor body 50 (e.g. a silicon body without germanium). Thus, it is desirable not to expose the semiconductor body 60 in a space 25s through the process of selectively removing the insulating layers 25.

Specifically, the top end of the semiconductor body 60 is formed to be positioned at a level between the source layer 10 and the top surface of the insulating layer 13. Thus, it is possible to suppress damages by the wet etching of the insulating layers 25, and to improve the reliability of the semiconductor memory device 1.

Figure 3I:
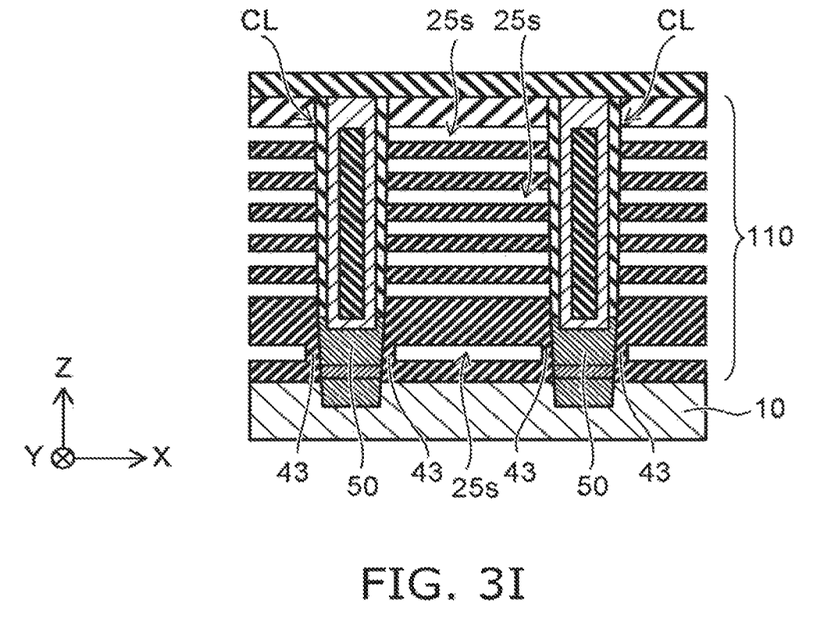

As shown in FIG. 3I, insulating layers 43 are formed on the lateral surfaces of the semiconductor body 50 which is exposed in a space 25s. The insulating layer 43 is, for example, a silicon oxide layer, and can be formed by thermally oxidizing the semiconductor body 50.

Figure 3J:
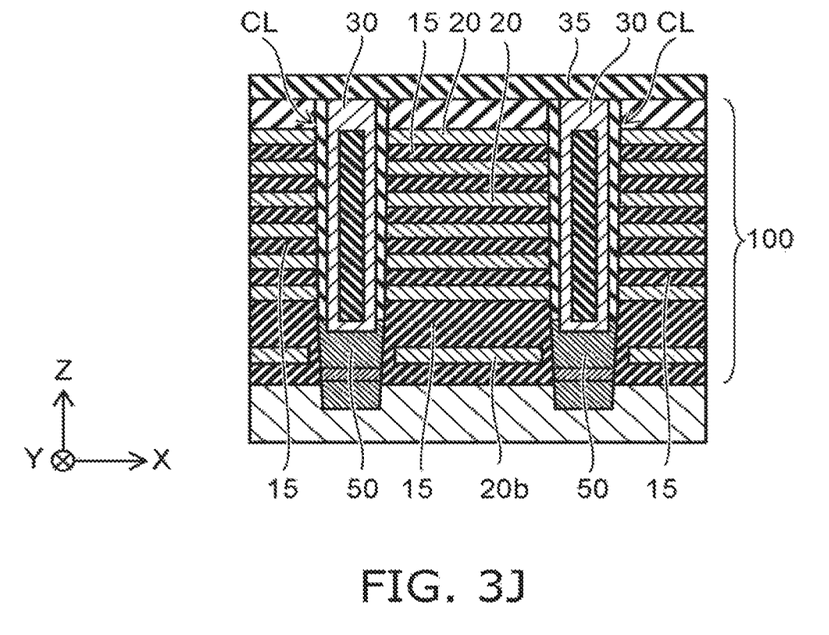

As shown in FIG. 3J, the stacked body 100 is completed by forming electrode layers 20 in the spaces 25s (see FIG. 3H) from which the insulating layers 25 are removed. The electrode layers 20 are, for example, metal layers formed using CVD in the spaces 25s. The electrode layers 20 has a structure, for example, in which a barrier metal layer 21 and a high-melting-point metal layer 23 such as tungsten and like are stacked (see FIG. 2B). The barrier metal layer 21 is, for example, titanium nitride (TiN) layer, and is formed between an insulating layer 15 and the high-melting-point metal layer 23 and between the columnar bodies CL and the high-melting-point metal layer 23.

Then, a source line SL is formed on an insulating layer 35, and electrically connected to source contact bodies LI via contact plugs Cs respectively (see FIG. 1). Further, an insulating layer 37 is formed to cover the source line SL and the insulating layer 35, and a plurality of bit lines BL are formed thereon (see FIG. 2A). A semiconductor layer 30 is electrically connected to any one of the bit lines BL via the contact plugs Cb and V1 formed in the insulating layers 35 and 37. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device comprising:
a conductive layer on a source side;
a first electrode layer provided above the conductive layer;
a second electrode layer provided between the conductive layer and the first electrode layer;

a semiconductor layer extending through the first electrode layer in a first direction from the conductive layer to the first electrode layer;

a first semiconductor body provided between the conductive layer and the semiconductor layer, the first semiconductor body including first impurities; and a second semiconductor body provided between the conductive layer and the first semiconductor body, the second semiconductor body including a first potion and a second portion, the first portion being positioned between the conductive layer and the first semiconductor body, and the second portion being positioned between the first portion and the first semiconductor body, the second semiconductor body including second impurities with a higher concentration than a concentration of the first impurities in the first semiconductor body, the second portion includes a part of the second impurities with a lower concentration than a concentration of another part of the second impurities in the first portion and with a higher concentration than a concentration of the first impurities in the first semiconductor body, and a diffusion coefficient of the second impurities in the second semiconductor body being smaller than a diffusion coefficient of the first impurities in the first semiconductor body.

2. The semiconductor memory device according to claim 1, wherein
the first semiconductor body extends in the first direction through the second electrode layer.

3. The semiconductor memory device according to claim 2, wherein
the first semiconductor body has one end positioned at a level between the conductive layer and the second electrode layer, and another end positioned at a level between the first electrode layer and the second electrode layer.

4. The semiconductor memory device according to claim 1, wherein
the second semiconductor body has one end positioned at a level between the conductive layer and the second electrode layer, and another end positioned in the conductive layer.

5. The semiconductor memory device according to claim 4, wherein
the first semiconductor body covers the one end of the second semiconductor body.

6. The semiconductor memory device according to claim 1, wherein
the second semiconductor body is electrically connected to the conductive layer.

7. The semiconductor memory device according to claim 1, wherein
the semiconductor layer has a poly-crystalline structure, and
the first and second semiconductor bodies have a single-crystalline structure.

8. The semiconductor memory device according to claim 1, further comprising:
a plurality of first electrode layers stacked in the first direction,
wherein the semiconductor layer extends in the first direction through the first electrode layers.

9. The semiconductor memory device according to claim 1, further comprising:

a memory cell including a charge storage portion provided between the first electrode layer and the semiconductor layer.

10. The semiconductor memory device according to claim 1, wherein
the first electrode layer and the second electrode layer each include metal.

11. The semiconductor memory device according to claim 1, wherein the first semiconductor body includes no intentionally doped impurity.

12. A semiconductor memory device comprising:
a conductive layer on a source side;
a first electrode layer provided above a conductive layer;
a second electrode layer provided between the conductive layer and the first electrode layer;
a semiconductor layer extending through the first electrode layer in a first direction from the conductive layer to the first electrode layer;
a first semiconductor body provided between the conductive layer and the semiconductor layer, and extending though the second electrode layer, the first semiconductor body including first impurities; and
a second semiconductor body provided between the conductive layer and the first semiconductor body, the second semiconductor body including second impurities with higher concentration than a concentration of the first impurities in the first semiconductor body,
the first semiconductor body and the second semiconductor body each including silicon as a main constituent;
the second semiconductor body further including at least one of germanium and carbon with a higher concentration in a portion positioned at a level of a surface of the conductive layer on the second electrode layer side than a concentration of the at least one of germanium and carbon in an end portion of the first semiconductor body on the semiconductor layer side.

13. The semiconductor memory device according to claim 12, wherein
the semiconductor layer is a poly-crystalline silicon layer, and
the first and second semiconductor bodies are single-crystalline silicon layers.

14. The semiconductor memory device according to claim 12, wherein
the second impurities are at least one of boron, arsenic and phosphorus.

15. The semiconductor memory device according to claim 12, further comprising:
a silicon oxide layer provided between the second electrode layer and the first semiconductor body.

16. The semiconductor memory device according to claim 12, wherein
the second semiconductor body has one end positioned at a level between the conductive layer and the second electrode layer, and another end positioned in the conductive layer.

17. The semiconductor memory device according to claim 12, wherein
the second semiconductor body is electrically connected to the conductive layer.

18. The semiconductor memory device according to claim 12, further comprising:
a plurality of first electrode layers stacked in the first direction,
wherein the semiconductor layer extends in the first direction through the first electrode layers.

19. The semiconductor memory device according to claim 12, further comprising:
a memory cell including a charge storage portion provided between the first electrode layer and the semiconductor layer.

20. The semiconductor memory device according to claim 12, wherein
the first electrode layer and the second electrode layer each include metal.

21. A semiconductor memory device comprising:
a conductive layer on a source side;
a first electrode layer provided above the conductive layer;
a second electrode layer provided between the conductive layer and the first electrode layer;
a semiconductor layer extending through the first electrode layer in a first direction from the conductive layer to the first electrode layer, the semiconductor layer having a poly-crystalline structure;
a first semiconductor body provided between the conductive layer and the semiconductor layer, the first semiconductor body having a single-crystalline structure, and including first impurities; and
a second semiconductor body provided between the conductive layer and the first semiconductor body, the second semiconductor body having a single-crystalline structure, and including second impurities with a higher concentration than a concentration of the first impurities in the first semiconductor body,
a diffusion coefficient of the second impurities in the second semiconductor body being smaller than a diffusion coefficient of the first impurities in the first semiconductor body.

22. The semiconductor memory device according to claim 21, wherein
the first semiconductor body extends in the first direction through the second electrode layer.

23. The semiconductor memory device according to claim 22, wherein
the first semiconductor body has one end positioned at a level between the conductive layer and the second electrode layer, and another end positioned at a level between the first electrode layer and the second electrode layer.

24. The semiconductor memory device according to claim 21 wherein
the second semiconductor body has one end positioned at a level between the conductive layer and the second electrode layer, and another end positioned in the conductive layer.

25. The semiconductor memory device according to claim 24, wherein
the first semiconductor body covers the one end of the second semiconductor body.

26. The semiconductor memory device according to claim 21, wherein the second semiconductor body is electrically connected to the conductive layer.

27. The semiconductor memory device according to claim 21, wherein the first semiconductor body includes no intentionally doped impurity.

* * * * *